(12) United States Patent
Kats et al.

(10) Patent No.: US 8,188,415 B2
(45) Date of Patent: May 29, 2012

(54) TERRESTRIAL SOLAR TRACKING PHOTOVOLTAIC ARRAY

(75) Inventors: Mikhail Kats, Rockaway, NJ (US);
Peter Allen Zawadzki, Clinton, NJ (US); Travis Dodd, Albuquerque, NM (US); James Sherman, Hillsborough, NJ (US); Gary D. Hering, Belle Mead, NJ (US); John Iannelli, San Marino, CA (US)

(73) Assignee: Emcore Solar Power, Inc., Albuquerque, NM (US)

( * ) Notice: Subject to any disclaimer, the term of this patent is extended or adjusted under 35 U.S.C. 154(b) by 251 days.

(21) Appl. No.: 12/478,567

(22) Filed: Jun. 4, 2009

(65) Prior Publication Data
US 2010/0101625 A1 Apr. 29, 2010

Related U.S. Application Data

(63) Continuation-in-part of application No. 12/257,670, filed on Oct. 24, 2008.

(51) Int. Cl.
*G01C 21/02* (2006.01)
*F24J 2/38* (2006.01)
*H01L 31/042* (2006.01)

(52) U.S. Cl. ............ 250/203.4; 126/605; 136/246
(58) Field of Classification Search ........... 250/203.4, 250/203.1, 203.3; 136/246, 251, 259; 126/576, 126/684, 605
See application file for complete search history.

(56) References Cited

U.S. PATENT DOCUMENTS

| | | | |
|---|---|---|---|
| 4,031,385 A | 6/1977 | Zerlaut et al. | |
| 4,172,739 A | 10/1979 | Tassen | |
| 4,345,582 A | 8/1982 | Aharon | |
| 4,425,904 A | 1/1984 | Butler | |
| 4,585,318 A | 4/1986 | Seifert | |
| 4,628,142 A * | 12/1986 | Hashizume | 136/246 |
| 4,832,001 A | 5/1989 | Baer | |
| 4,989,124 A | 1/1991 | Shappell | |

(Continued)

FOREIGN PATENT DOCUMENTS

DE 10 2004 01815 A1 10/2005

(Continued)

OTHER PUBLICATIONS

"Concentrating PV module and system developers." Photon International: The Photovoltaic Magazine. Aug. 2009. pp. 134-137. PHOTON Europe GmbH, Aachen, Germany.

(Continued)

*Primary Examiner* — Georgia Y Epps
*Assistant Examiner* — Don Williams

(57) ABSTRACT

The terrestrial solar tracking photovoltaic array includes a longitudinal support that may be constructed of discrete sections. The overall length of the array may be adjusted depending upon the necessary size of the array. A drive may be configured to rotate the longitudinal support in first and second directions about a first axis. Solar cell modules are positioned along the longitudinal support and may each include a rectangular case with a plurality of lenses that are positioned over corresponding receivers. Linkages may be connected to the solar cell modules and are axially movable along the longitudinal support to rotate the solar cell modules within second planes that each orthogonal to the first plane to further track the sun during the course of the day. The array may be configured to facilitate rotation about the first axis. The array may be constructed with a center of gravity of the array to extending through the longitudinal support.

28 Claims, 16 Drawing Sheets

U.S. PATENT DOCUMENTS

| | | | |
|---|---|---|---|
| 5,169,456 | A | 12/1992 | Johnson |
| 5,600,124 | A | 2/1997 | Berger |
| 5,798,517 | A | 8/1998 | Berger |
| 6,058,930 | A | 5/2000 | Shingleton |
| 6,123,067 | A | 9/2000 | Warrick |
| 6,465,725 | B1 | 10/2002 | Shibata et al. |
| 6,552,257 | B1 | 4/2003 | Hart et al. |
| 6,563,040 | B2 | 5/2003 | Hayden et al. |
| 6,722,357 | B2* | 4/2004 | Shingleton ............ 126/600 |
| 6,960,717 | B2 | 11/2005 | Stuart et al. |
| 7,252,084 | B2 | 8/2007 | Pawlenko et al. |
| 7,381,886 | B1 | 6/2008 | Aiken et al. |
| 7,795,568 | B2 | 9/2010 | Sherman |
| 2004/0112373 | A1 | 6/2004 | Djeu |
| 2007/0089777 | A1 | 4/2007 | Johnson, Jr. et al. |
| 2007/0101738 | A1 | 5/2007 | Akei et al. |
| 2007/0188876 | A1 | 8/2007 | Hines et al. |
| 2007/0193620 | A1 | 8/2007 | Hines et al. |
| 2008/0128586 | A1 | 6/2008 | Johnson et al. |
| 2008/0135087 | A1 | 6/2008 | Anikara |
| 2008/0178867 | A1 | 7/2008 | DiDomenico |
| 2008/0236567 | A1* | 10/2008 | Hayden ............ 126/569 |
| 2008/0258051 | A1 | 10/2008 | Heredia et al. |
| 2009/0000662 | A1 | 1/2009 | Harwood et al. |
| 2009/0032014 | A1 | 2/2009 | Meydbray |
| 2009/0032084 | A1 | 2/2009 | Aiken et al. |
| 2009/0032086 | A1 | 2/2009 | Kats et al. |
| 2010/0011565 | A1 | 1/2010 | Zawadzki et al. |
| 2010/0018570 | A1 | 1/2010 | Cashion et al. |
| 2010/0032004 | A1 | 2/2010 | Baker et al. |
| 2010/0101630 | A1 | 4/2010 | Kats et al. |
| 2010/0101632 | A1 | 4/2010 | Kats et al. |
| 2010/0102200 | A1 | 4/2010 | Kats et al. |
| 2010/0102202 | A1 | 4/2010 | Sherman |
| 2010/0108860 | A1 | 5/2010 | Sherman et al. |
| 2010/0258110 | A1 | 10/2010 | Krabbe et al. |
| 2010/0294337 | A1 | 11/2010 | Sherman et al. |

FOREIGN PATENT DOCUMENTS

| | | |
|---|---|---|
| DE | 20 2006 00347 U1 | 12/2006 |
| ES | 2268938 A1 | 3/2007 |
| JP | 2000196127 | 7/2000 |
| JP | 2000223730 | 8/2000 |
| JP | 2002202817 | 7/2002 |
| WO | WO 0155651 A1 | 8/2001 |
| WO | WO 02079793 | 10/2002 |
| WO | 2008/008023 A1 | 1/2008 |
| WO | WO 2008/090241 A1 | 7/2008 |
| WO | WO 2008/154945 | 12/2008 |
| WO | WO 2009/048879 | 4/2009 |

OTHER PUBLICATIONS

"WS T 1600—the world wide connected solar tracker." Data Sheet, 2 pages. www.ws-energia.com. WS Energia Lda, Oeiras, Portugal.

"WS T 160013 the world wide connected solar tracker." Data Sheet, 3 pages. www.ws-energia.com. WS Energia Lda, Oeiras, Portugal.

"WS T1000." Data Sheet, 2 pages. www.ws-energia.com. WS Energia Lda, Oeiras, Portugal.

"170 Watt NE-170UC1." Data Sheet, 2 pages. Sharp.co.jp. Sharp Electronics Corp., Huntington Beach, CA.

"OPEL SF-4M Roof Top Tracker." Data Sheet, 2 pages. www.opelinc.com. OPEL Solar Inc. Shelton, CT.

"FEiNA SF-4 Mini Tracker." Data Sheet, 2 pages. www.opelinc.com. OPEL Solar Inc. Shelton, CT.

"SF-40 H1 Rooftop Tracker." Data Sheet, 2 pages. www.opelinc.com. OPEL Solar Inc. Shelton, CT.

"OPEL TF-800 Single Axis Tracker." Data Sheet, 2 pages. www.opelinc.com. OPEL Solar Inc. Shelton, CT.

"FEiNA SF-9 Dual Axis Tracker." Data Sheet, 2 pages. www.opelinc.com. OPEL Solar Inc. Shelton, CT.

"FEiNA SF-20 Dual Axis Tracker." Data Sheet, 2 pages. www.opelinc.com. OPEL Solar Inc. Shelton, CT.

"OPEL SF-20 CPV Dual Axis Tracker." Data Sheet, 2 pages. www.opelinc.com. OPEL Solar Inc. Shelton, CT.

"TF-500 Dual Axis Tracker." Data Sheet, 2 pages. www.opelinc.com. OPEL Solar Inc. Shelton, CT.

"Mk-Id High Concentration Photovoltaic Panel (HCPV)." Data Sheet, 2 pages. www.opelinc.com. OPEL Solar Inc. Shelton, CT.

"PS140 Solar Concentrator." Data Sheet, 2 pages. www.power-spar.com. Power-Spar, Markham, Ontario, Canada.

Fraas, L., et al., "Start-Up of First 100 kW System in Shanghai with 3-Sun PV Mirror Modules." 4 pages. Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA.

Fraas, L., et al., "Test Sites and Testing of 3-Sun Mirror Modules." 4 pages. Presented at IEE 4th World Conference on Photovoltaic Energy Conversion, Waikoloa, Hawaii, May 9, 2006. Jxcrystals.com JX Crystals, Inc., Issaquah, WA.

"SunCube Specifications." Data Sheet, 4 pages. www.greenandgoldenergy.com.au. Green and Gold Energy Pty. Ltd., Glynde, Australia.

"Sunflower Fully-Integrated, Smart HCPV." Data Sheet, 2 pages. www.energyinnovations.com. Energy Innovations, Poway, CA.

Picture of GE Concentrator Array, circa 1983, Sandia.

Luque, A. and Hegedus, S., eds. Handbook of Photovoltaic Science and Engineering. Wiley: Hoboken, NJ. 2003. Sections 9.8 and 9.9 and Chapter 11. 64 pages total. ISBN 1591247748. Ebook accessed through North Carolina State University Libraries. http://catalog.lib.ncsu.edu/web2/tramp2.exe/goto/A1hl1rqj.002?screen=Record.html&server=1home&item=3.

U.S. Appl. No. 12/791,580, filed Jun. 1, 2010, Kats et al.

U.S. Appl. No. 12/828,734, filed Jul. 1, 2010, Kozin.

U.S. Appl. No. 12/830,926, filed Jul. 6, 2010, Sherman.

"Kinematics slewing drives" Product description. 1 page. www.kinematicsmfg.com/Products/slewing-drives.aspx. Kinematics Manufacturing, Inc. Phoenix, AZ.

"Slewing Drives S7b-73m-32ra." Data Sheet, 2 pages. www.kinematicsmfg.com/Products/slewing-drives/SlewingDrivesProducts/Slewing-Drives-S7B-73M-32RA.aspx. Kinematics Manufacturing, Inc. Phoenix, AZ.

"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).

"GLOBO-welding. Laser welding of plastics—innovative and flexible. The universal processing concept for 3D and continuous applications." Brochure. http://www.leister.com/uploads/pdf/en/BRO_GLOBO_Welding_dv092006_ENG.pdf. Sep. 2006. Leister Process Technologies. Kaegiswil, Switzerland. (4 pages).

"Shop SABRE, a N.A.C.S.I Company. 'The Way CNC Was Meant to Be.'" Laser Product Information. http://www.shopsabre.com/Laser%20Page.html. No date of web publication given. Shop SABRE. Elko, Minnesota, USA. (4 pages).

* cited by examiner

TERRESTRIAL SOLAR TRACKING PHOTOVOLTAIC ARRAY

RELATED APPLICATION

The present application is a continuation-in-part of U.S. patent application Ser. No. 12/257,670 filed Oct. 24, 2008, and herein incorporated by reference in its entirety.

BACKGROUND

The present application is directed to a terrestrial solar tracking photovoltaic array and, more particularly, to a modular array with solar cell modules that are simultaneously movable about first and second orthogonal axes to maintain the solar cell modules aligned with the sun.

Terrestrial solar tracking photovoltaic arrays are used for various applications. The arrays are designed for a specific output capacity and cannot be modified in a convenient manner for different capacities. The set capacity of the arrays may vary from being relatively small, such as a few kilowatts, to relatively large in excess of hundreds of kilowatts. The arrays may be installed at various locations that have exposure to the sun for adequate periods of time to produce the required power capacity.

The photovoltaic arrays generally include a frame with one or more solar cell modules in the form of panels. The frame may be adjustable to position the solar cell modules towards the sun. The frame may adjust the position of the solar cell modules throughout the day to ensure they remain directed to the sun to maximize the power capacity.

Many existing photovoltaic arrays include large frames that support the solar cell modules. The size of the frames and installation requirements often result in their costs being substantial. Initially, the frames are moved by large trucks or other like equipment to the installation site. Cranes or other like lifting equipment are necessary to lift the frames from the trucks and position them at the correct location. This installation process often requires a large workforce due to the extensive moving and assembly requirements of mounting the frame and attaching the associated solar cell modules. These prior designs did not allow for a single person or just a few persons to install the frame and solar cell modules.

These prior frames also provide for mounting a predetermined number of solar cell modules. There was no ability to modify the number of solar cell modules to accommodate the specific needs of the array. Particularly, there is no manner of modifying the design out in the field during or after the installation.

SUMMARY

The present application is directed to a terrestrial solar tracking photovoltaic array. The array may include a modular design that is sized and weighted to facilitate installation with a small amount of manpower. The array further is adapted to be adjusted during or after installation to accommodate the necessary power requirements.

The terrestrial solar tracking photovoltaic array includes a longitudinal support that may be constructed of discrete sections. The overall length of the array may be adjusted depending upon the necessary size of the array. A drive may be configured to rotate the longitudinal support in first and second directions about a first axis. Solar cell modules are positioned along the longitudinal support and may each include a rectangular case with a plurality of lenses that are positioned over corresponding receivers. Linkages may be connected to the solar cell modules and are axially movable along the longitudinal support to rotate the solar cell modules within second planes that are each orthogonal to the first plane to further track the sun during the course of the day.

The array may be configured to facilitate rotation about the first axis. The array may be constructed with a center of gravity of the array to extending through the longitudinal support. The array may also include mechanisms to facilitate rotation.

The various aspects of the various embodiments may be used alone or in any combination, as is desired.

DETAILED DESCRIPTION

Figure 1:
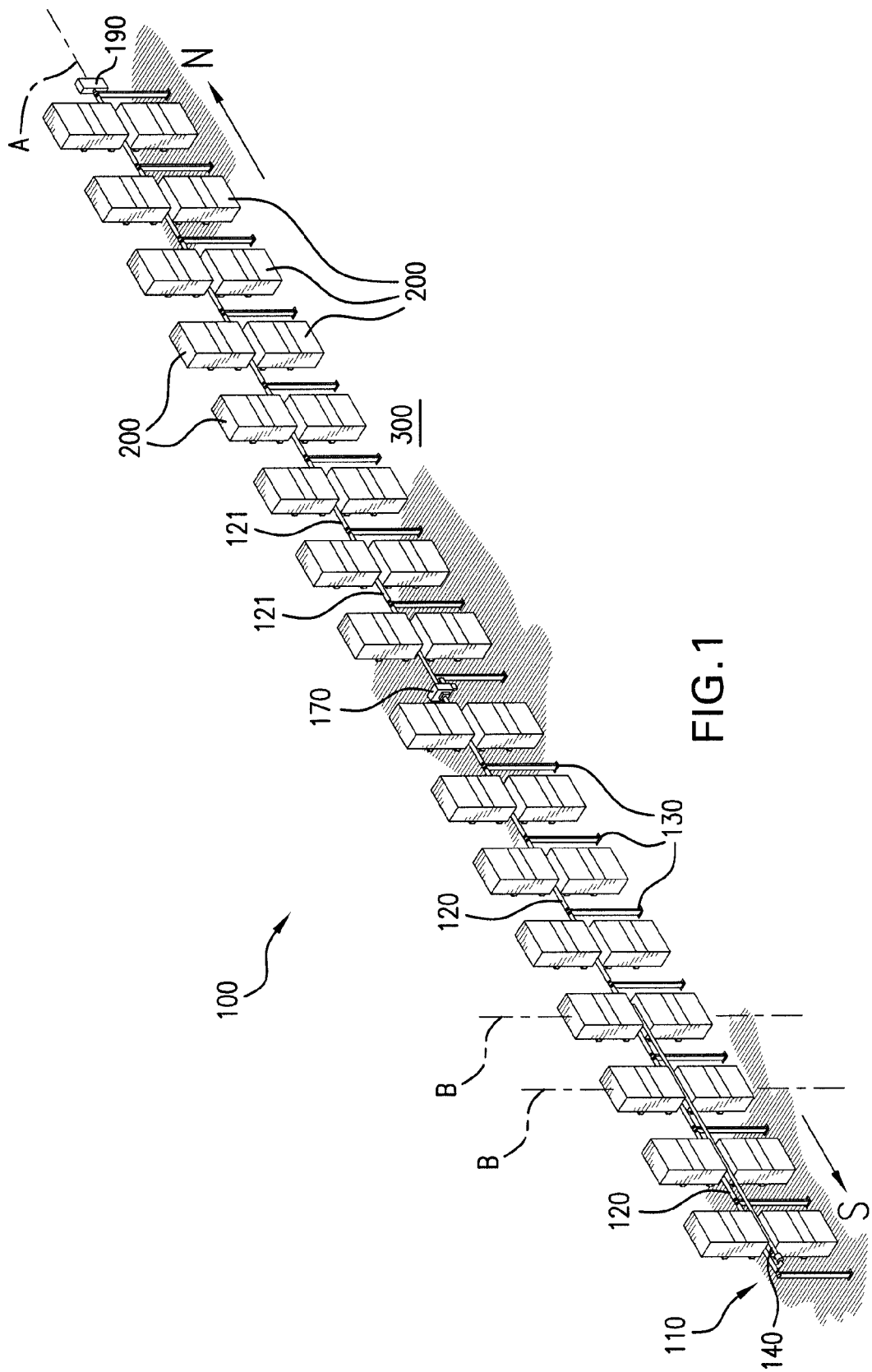
FIG. 1 is a perspective view of a terrestrial solar tracking photovoltaic array according to one embodiment.

The present application is directed to a terrestrial solar tracking photovoltaic array. FIG. 1 illustrates an embodiment of an array generally illustrated as element 100. The array 100 includes an elongated frame 110 configured to mount solar cell modules 200 in a longitudinally-extending and spaced-apart arrangement. The frame 110 is able to rotate each of the solar cell modules 200 along a first axis A to simultaneously track the elevation of the sun during the course of a day. The frame 114 is able to rotate each solar cell module 200 along axes B that are substantially, perpendicular to axis A to track the azimuthal position of the sun during the course of the day.

Frame 110 positions the solar cell modules 200 to track the movement of the sun. Frame 110 includes a longitudinal support 120 that is positioned above a surface 300 by spaced-apart vertical supports 130. In one embodiment, the longitudinal support 120 is a single continuous piece. In one specific embodiment, the longitudinal support 120 is a pipe with a diameter of about 4 inches and includes a thickness of about 0.167 inches. The pipe includes a length of about 192" and weighs about 110 lbs.

In another embodiment, the longitudinal support 120 may be constructed from a number of discrete sections 121 that are connected together in an end-to-end arrangement. The lengths and construction of each section 121 may be the same or may be different. In one embodiment, each section 121 is sized to mount a pair or multiple pairs of solar cell array modules 200. The modular design provides for a user to construct the longitudinal support 120 to a length needed to support a necessary number of solar cell modules 200. Sections 121 may be added to an existing frame 110 to accommodate additional solar cell modules 200 as is necessary for the array 100 to produce the desired power output.

Figure 2:
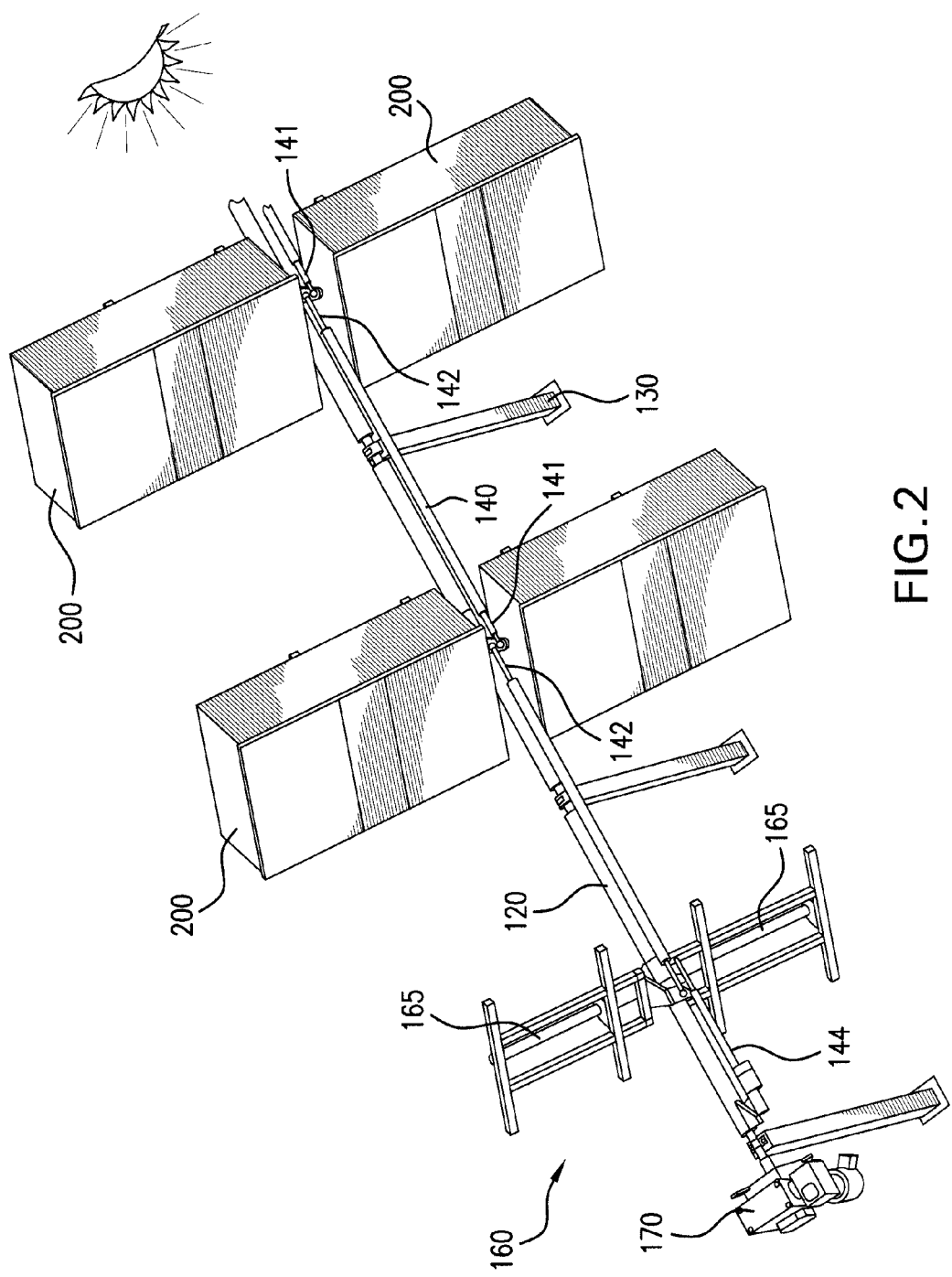
FIG. 2 is a perspective view of a mount and solar cell modules connected to a longitudinal support according to one embodiment.
Figure 3:
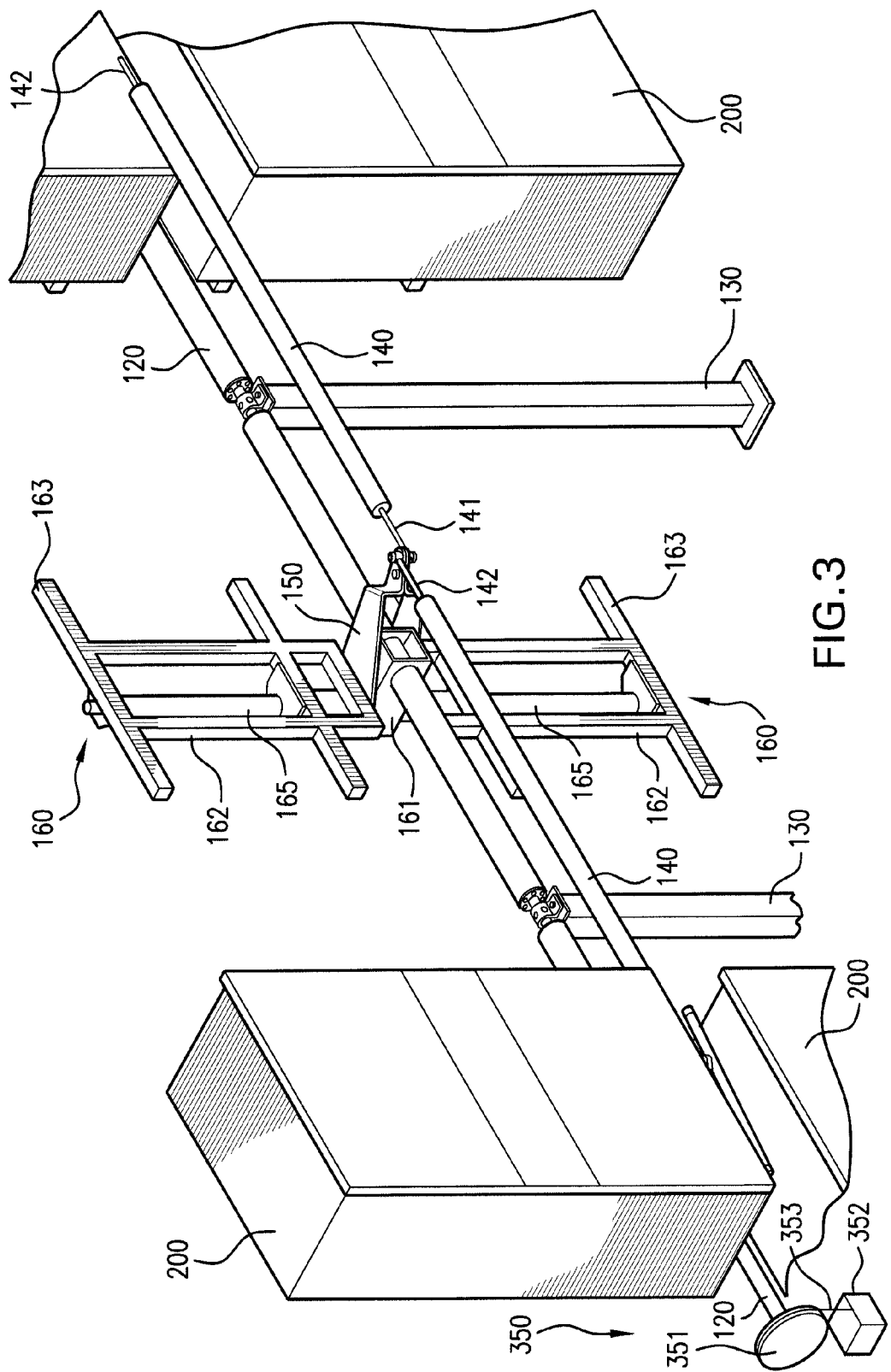
FIG. 3 is a perspective view of a mount connected to a longitudinal support according to one embodiment.
Figure 4:
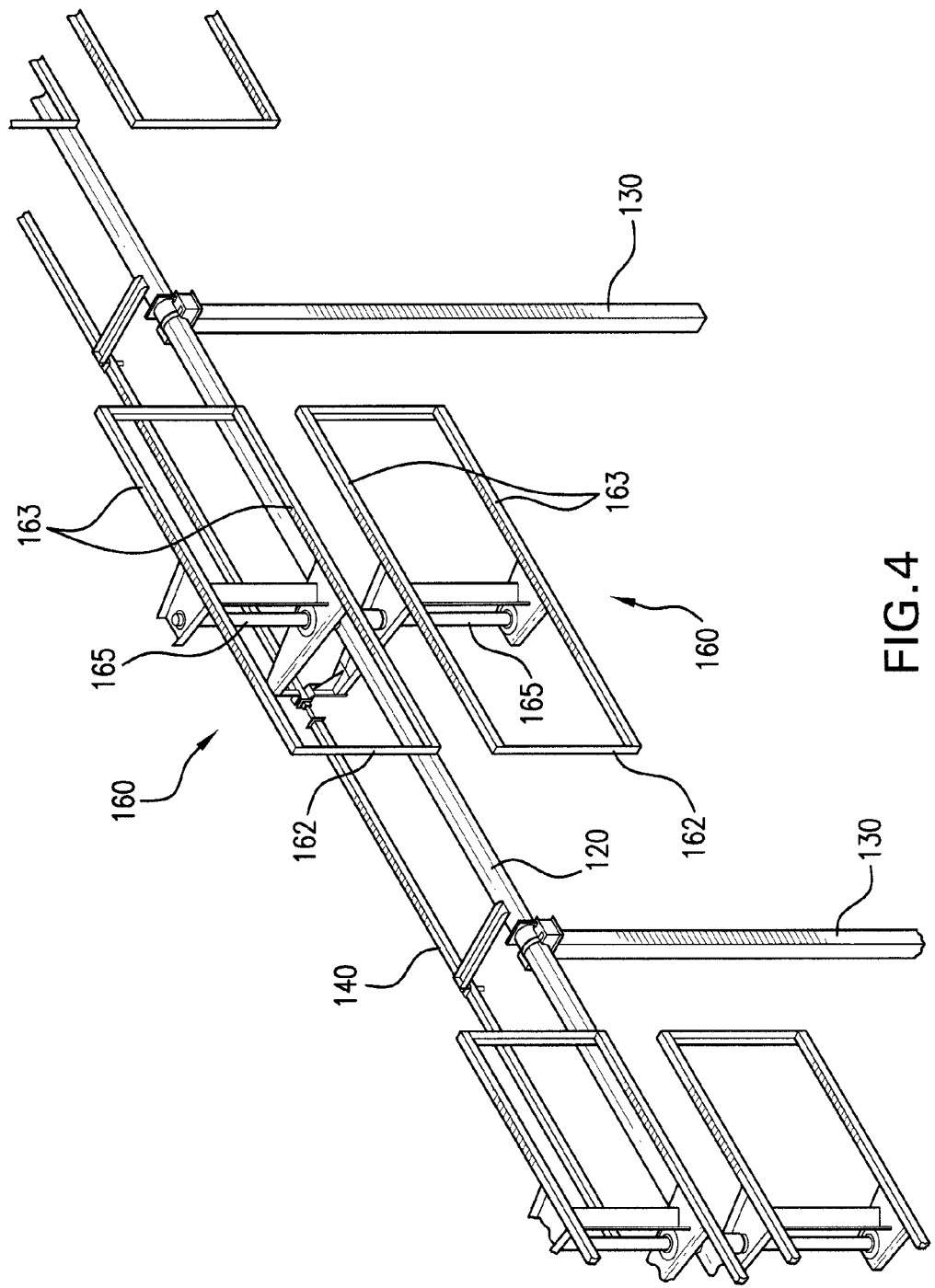
FIG. 4 is a perspective view of a pair of mounts connected to a longitudinal support according to one embodiment.
Figure 5:
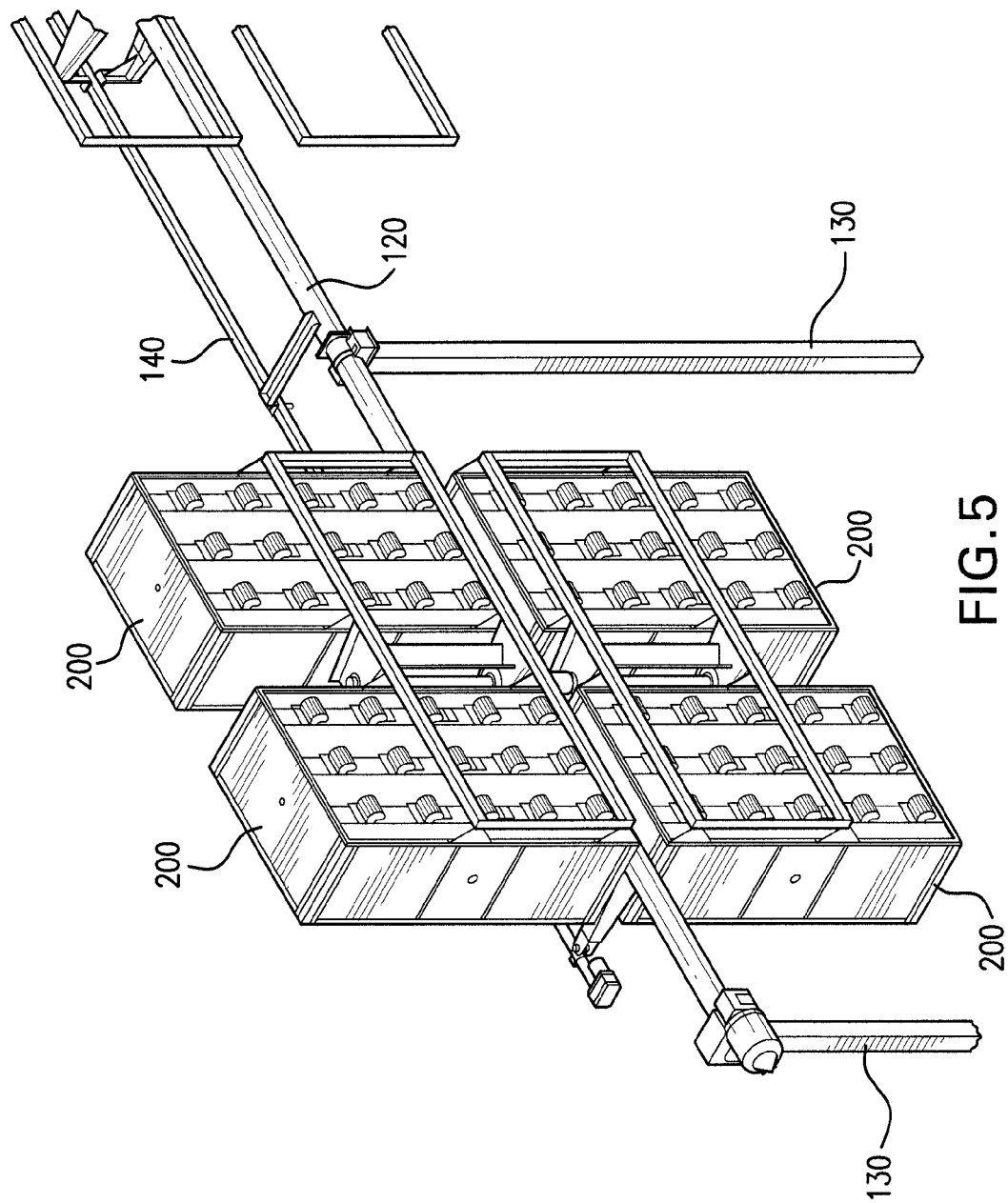
FIG. 5 is a perspective view of mounts and solar cell modules connected to a longitudinal support according to one embodiment.
Figure 6:
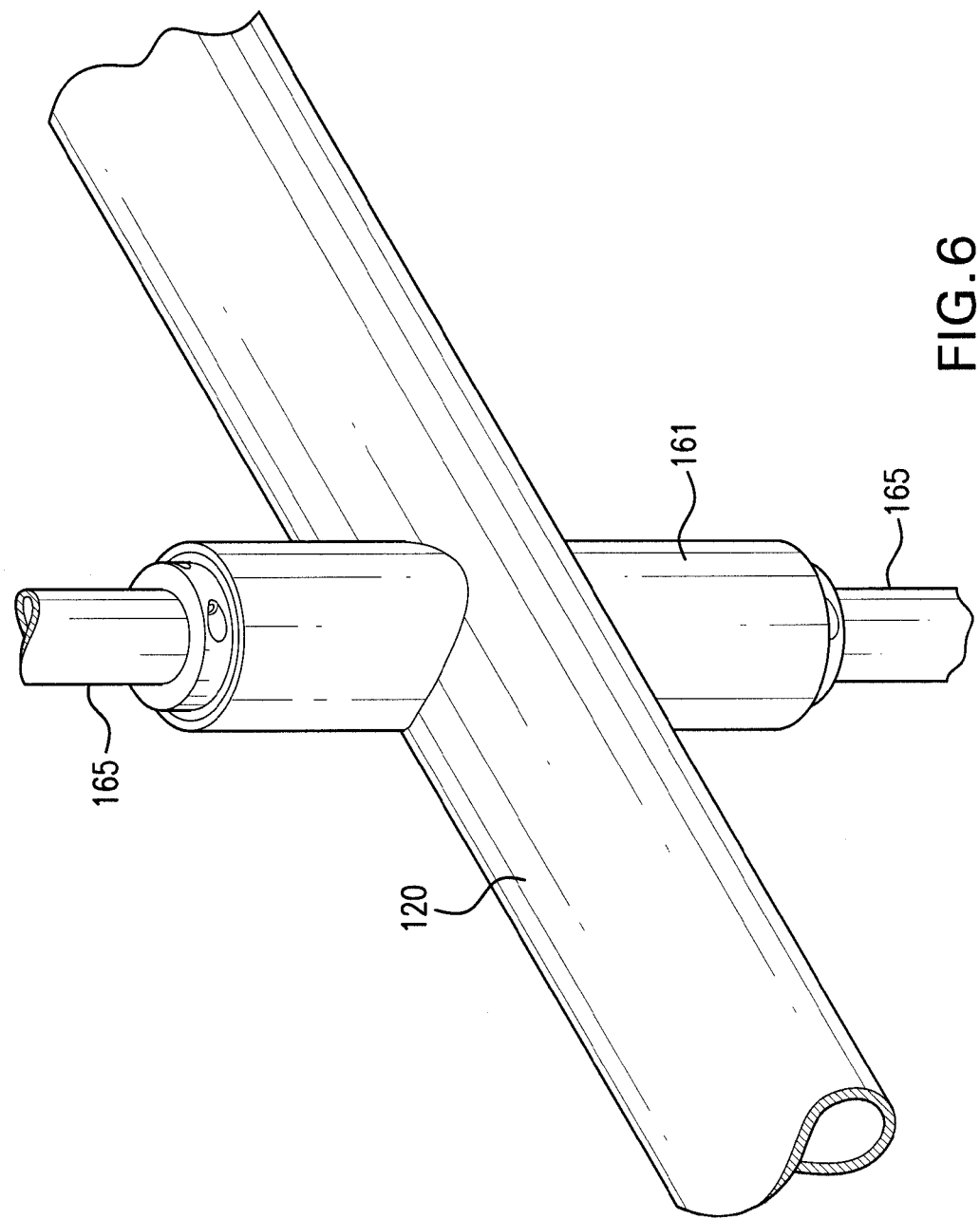
FIG. 6 is a perspective view of a base connected to a longitudinal support according to one embodiment.

Mounts 160 support the solar cell modules 200 and are connected to the longitudinal support 120. Mounts 160 may be connected to the longitudinal support 120 at least in part through a base 161 as best illustrated in FIGS. 3 and 6. The mounts 160 may include vertical members 162 and horizontal members 163 that support the solar cell modules 200. Mounts 160 may be of different sizes to accommodate different numbers of solar cell modules 200. FIGS. 2 and 3 include the mounts 160 sized to each attach to one solar cell module 200. FIGS. 4 and 5 include mounts 160 sized to receive two solar cell modules 200.

Mounts 160 may also include a pivot member 165 that facilitates pivoting motion of the solar cell modules 200 about second axes B as will be explained in detail below. Pivot member 165 may extend through the base 161, or may be located away from the base 161. Further, the pivot member 165 may be a single elongated member or may be constructed of separate members that are positioned in an end-to-end orientation and connected at the base 161.

The mounts 160 may be positioned at various spacings along the length of the longitudinal support 120. FIGS. 2-5 include the mounts 160 aligned along the longitudinal support 120 in offsetting pairs on opposing sides of the longitudinal support 120 directly across from one another. Other offset positioning may include the mounts 160 unevenly spread along the length with equal numbers of mounts 160 extending outward from each opposing side of the longitudinal support 120. The offset positioning assists to balance the array 100 and facilitate rotation about the first axis A. Other configurations may include uneven numbers of mounts 160 extending outward from the opposing sides of the longitudinal support 120.

The vertical supports 130 are spaced apart along the length of the longitudinal support 120. The vertical supports 130 include a length adequate to position the solar cell modules 120 above the surface 300 for rotation about the first axis A. Therefore, the vertical supports 130 are longer than a height of the mounts 160 and the solar cell modules 200.

The vertical supports 130 are positioned along the longitudinal support 120 away from the mounts 160 to prevent interference with the movement of the solar cell modules 200. As illustrated in FIG. 1, the vertical supports 130 are spaced-apart from the solar cell modules 200 along the length of the longitudinal support 120. In this arrangement, the vertical supports 130 are in a non-overlapping arrangement with the solar cell modules 200. Various numbers of vertical supports 130 may be positioned along the length of the longitudinal support 120. In the embodiment of FIG. 1, a vertical support 130 is positioned between each pair of mounts 160. In other embodiments, the vertical supports 130 are spaced a greater distance apart along the longitudinal support 120. In one specific embodiment, the vertical supports 130 include a 4 inch by 4 inch rectangular shape, and include a thickness of about 0.188 inches. The vertical supports 130 may also be supported in a concrete pad.

A drive 170 is connected to the longitudinal support 120 to provide a force to rotate the longitudinal support 120 about axis A. In one embodiment, drive 170 may be positioned at an end of the longitudinal support 120. Drive 170 may include a drive train with one or more gears that engage with the longitudinal support 120. Additional drives 170 may be connected along the length of the longitudinal support 120 to provide additional rotational force.

Figure 7:
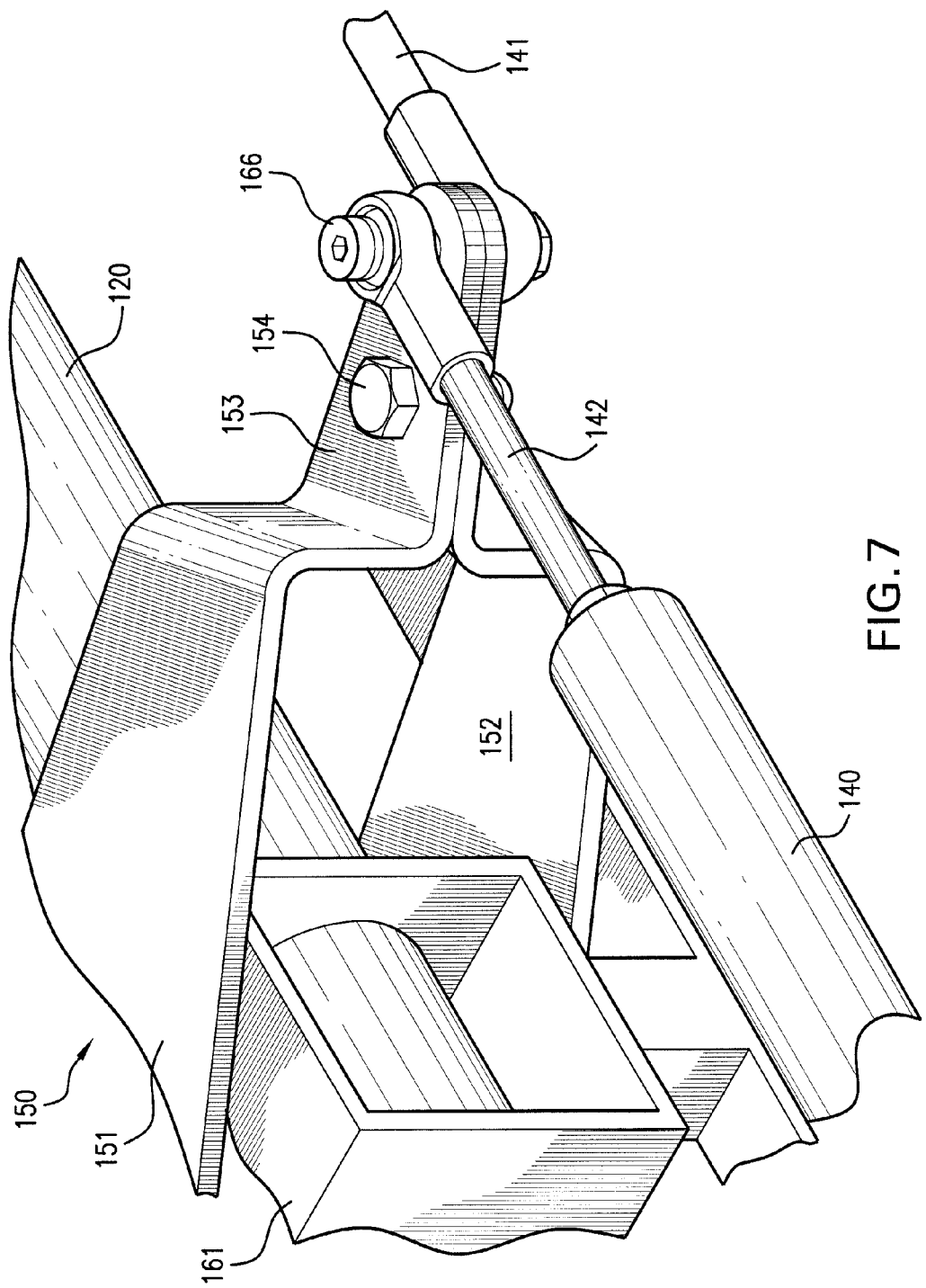
FIG. 7 is a partial perspective view of a linkage and a pivot coupling according to one embodiment.
Figure 8:
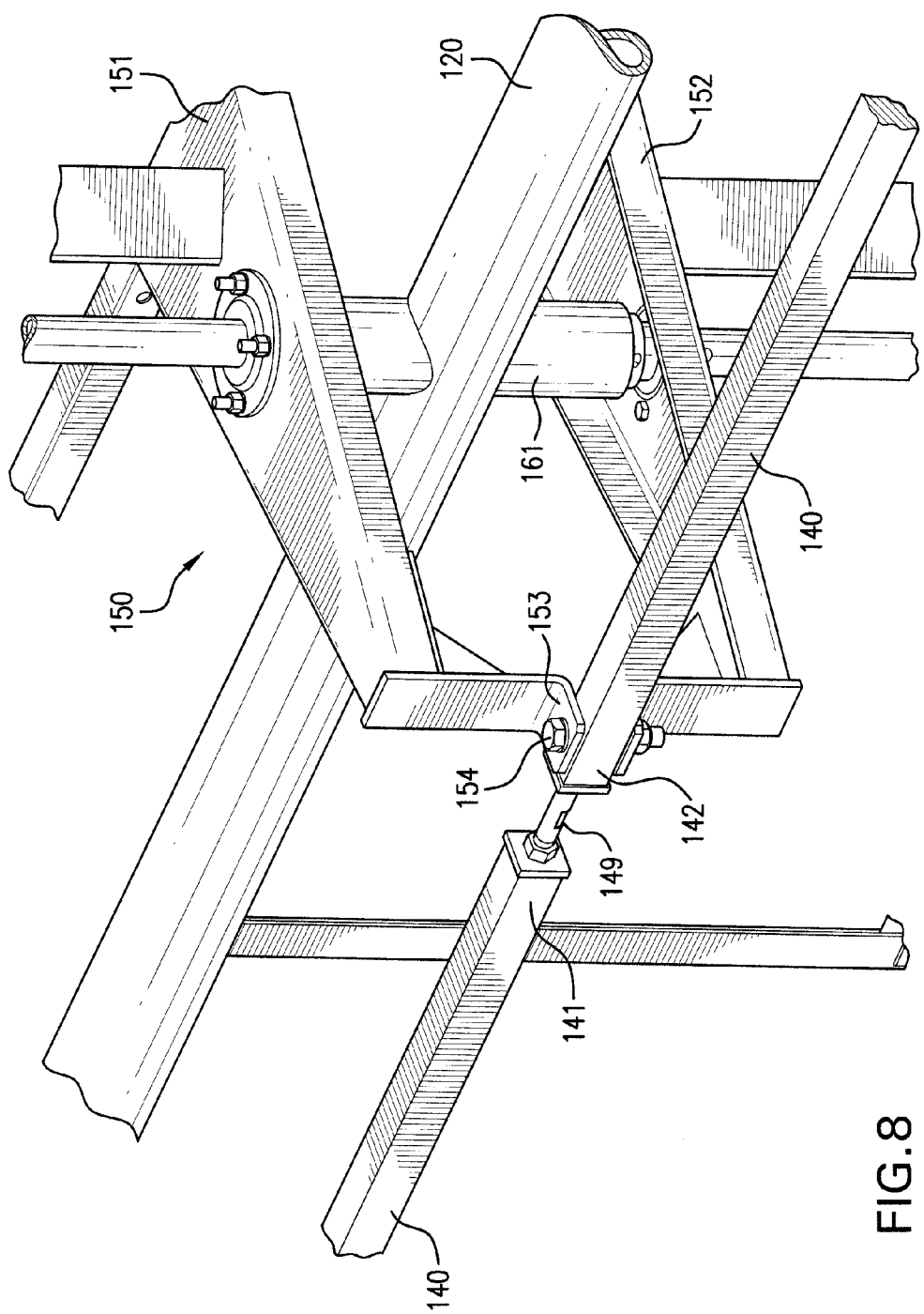
FIG. 8 is a perspective view of a coupling connected to linkages according to one embodiment.

A coupling 150 is attached to each mount 160 to enable the mount 160 and attached solar cell modules 200 to rotate about the second axis B. As best illustrated in FIGS. 3, 7, and 8, couplings 150 include first and second arms 151, 152 that are positioned on opposing sides of the base 161. The first arm 151 is operatively connected to a first mount 160, and the second arm 152 is operatively connected to a second mount 160. The arms 151, 52 are connected together at a neck 153. Arms 151, 152 may be constructed from separate pieces that are connected together with a fastener 154 that extends through the neck 153.

The couplings 150 are connected to rotate about the first axis A during rotation of the longitudinal support 120. The couplings 150 are also attached in a manner to rotate about the second axis B with the mounts 160. Because the arms 151, 152 are not connected to the base 161, the coupling 150 moves relative to the base 161 and longitudinal support 120 during rotation about the second axis B. In one embodiment, the arms 151, 152 are connected to the pivot member 165 that extends along a rear of the mounts 160.

Linkages 140 are connected to the mounts 160 for rotating the solar cell modules 200 about the second axes B. Each linkage 140 includes a first end 141 and a second end 142. The linkages 140 are attached together in a string aligned substantially parallel to the longitudinal support 120. FIGS. 3 and 7 include an embodiment with each coupling 150 attached to two separate linkages 140. Specifically, a first end 141 of a first linkage 140 and a second end 142 of a second linkage 140 are each connected to the coupling 150. The ends 141, 142 of the adjacent linkages 140 may be connected together by a common fastener 166 that extends through the neck 153 of the coupling 150.

FIG. 8 includes an embodiment with a single linkage 140 connected to the coupling 150. The end 142 is positioned between the arms 151, 152 and connected with a fastener 154. The adjacent linkage 140 is positioned in an end-to-end orientation and spaced away from the coupling 150. A connector 149 connects the linkages 140 together in the end-to-end orientation.

Figure 9:
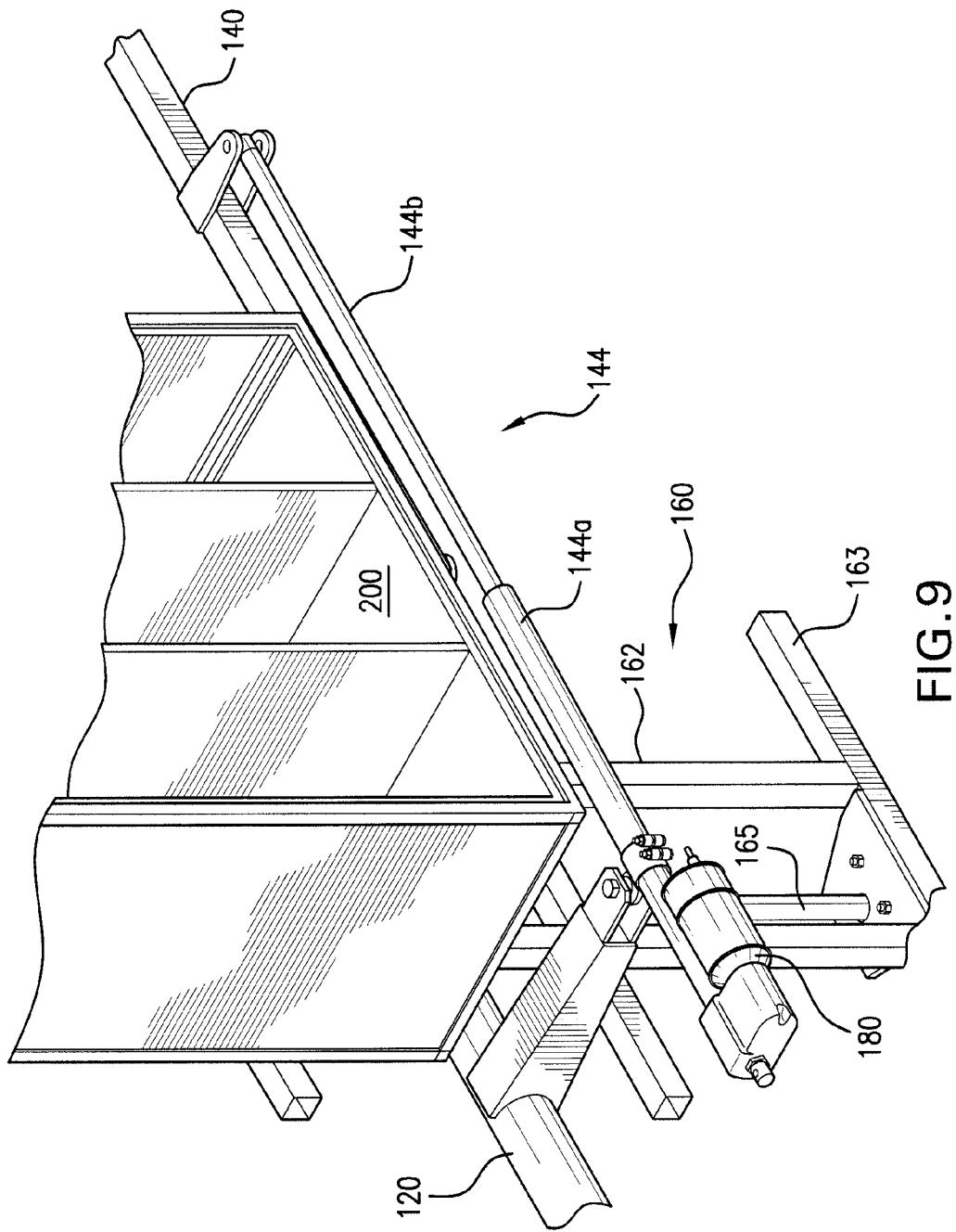
FIG. 9 is a partial perspective view of a mount connected to a longitudinal support and a drive operatively connected to the longitudinal support according to one embodiment.

A drive 180 is attached to a drive linkage 144 as illustrated in FIG. 9. The drive linkage 144 includes a first section 144a and a telescoping second section 144b. The first section 144a is operatively connected to the drive 180, and the second section 144b is operatively connected to a linkage 140. The drive 180 provides a force for moving the drive linkage 144 and the attached linkages 140 and thus pivoting the solar cell modules 200 about the second axes B. The number of linkages 140 in the string that is moved by the drive 180 and the drive linkage 144 may vary depending upon the context of use. In one embodiment, one or more additional drives 180 are positioned along the linkage string that work in combination with the drive 180 to move the linkages 140.

Figure 10:
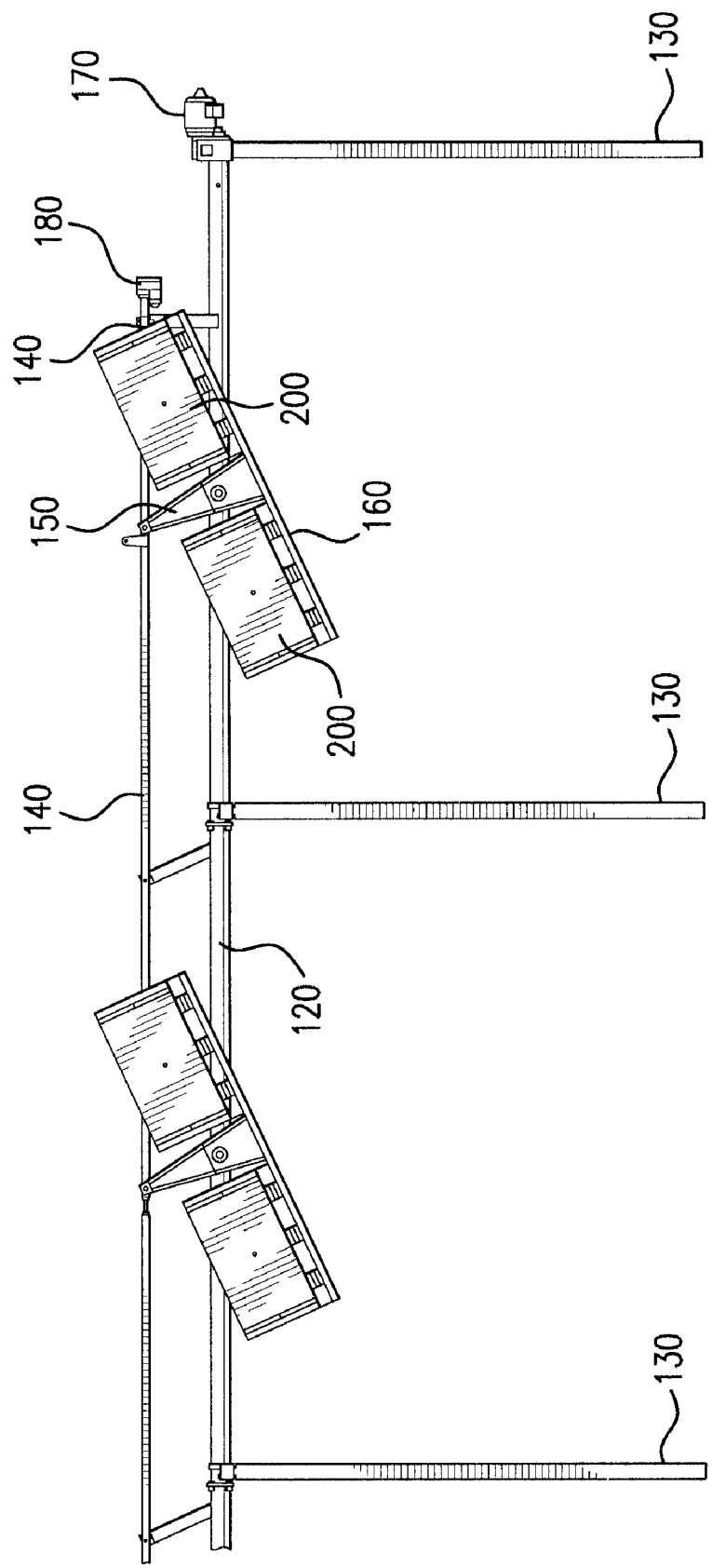
FIG. 10 is a top view of a portion of a terrestrial solar tracking photovoltaic array according to one embodiment.

FIG. 10 includes an embodiment with the drive linkage 144 connected to one or more mounts 160 adjacent to the drive 180. The mounts 160 are operatively connected to a linkage 140 through a coupling 150 as described above. The drive 180 directly rotates the mounts 160 with the rotational force being applied to the other, downstream linkages 140 through the coupling 150.

The array 100 is constructed to facilitate rotation of the longitudinal support 120 about the first axis A. The array 100 is designed to balance the power load requirements of the drive 170 during rotation through the various angular positions about the first axis A. One manner of balancing the load requirements is placing the mounts 160 and solar cell modules 200 such that a center of gravity of the array 100 is aligned with the longitudinal support 120. FIGS. 1 and 5 each illustrate examples of this positioning with equal numbers of mounts 160 and solar cell modules 200 extending outward from the opposing sides of the longitudinal support 120. FIGS. 1 and 5 illustrate the mounts 160 and solar cell modules 200 aligned in pairs that are directly across the longitudinal support 120 from each other. Other spacings may include the mounts 160 and solar cell modules 200 being unpaired and scattered along the length. The balanced system maintains a near constant potential energy as rotation in a first direction is facilitated by the weight of the mounts 160 and solar cell modules 200 that extend outward from a first side, and rotation in a second direction is facilitated by the opposing mounts 160 and solar cells 200 that extend outward from a second side of the longitudinal support 120.

Figure 13:
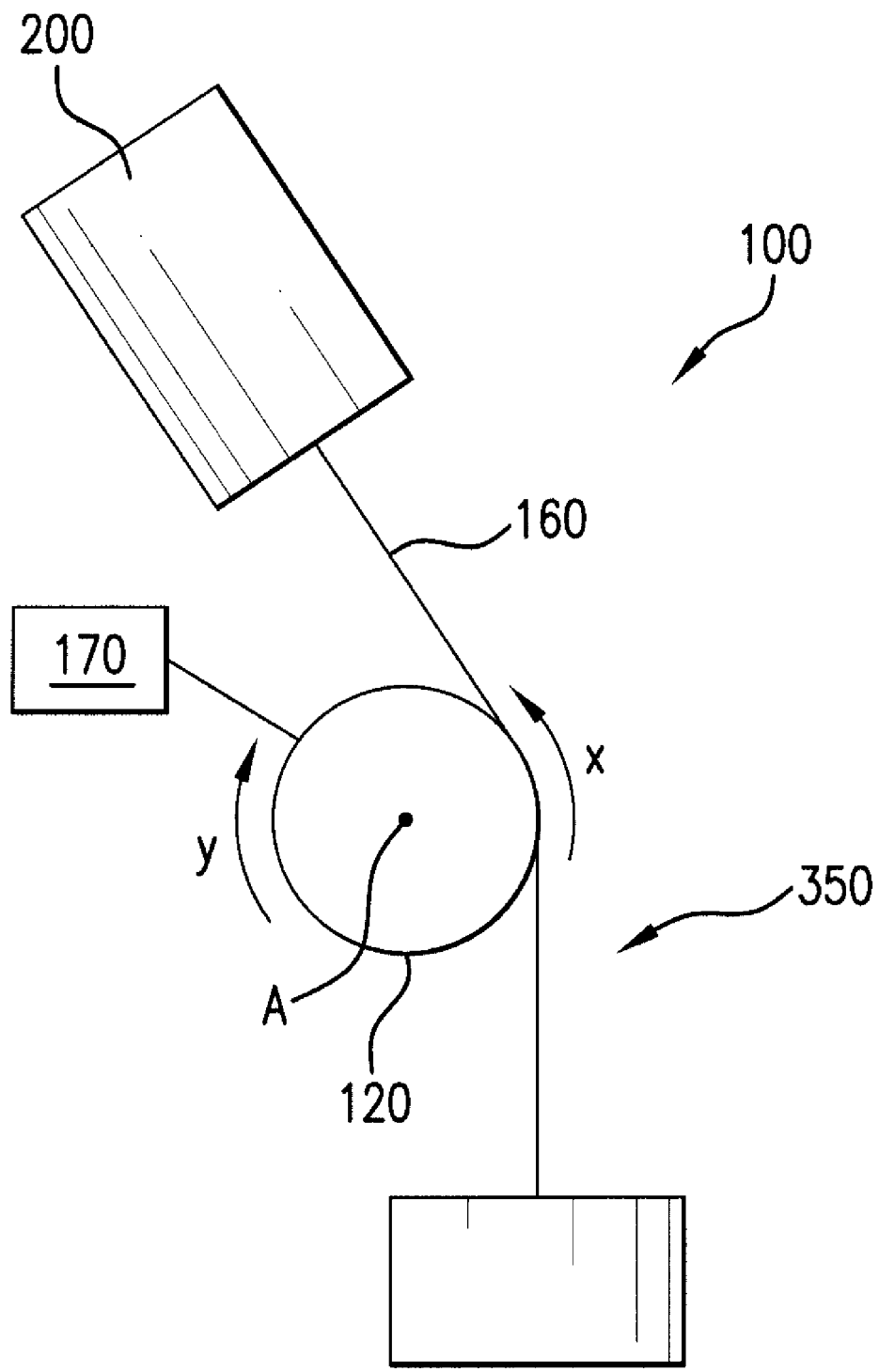
FIG. 13 is a schematic end view of a balancing mechanism operatively connected to a terrestrial solar tracking photovoltaic array according to one embodiment.

FIG. 13 illustrates a schematic end view of the array 100 with one or more solar cell modules 200 connected to the longitudinal support 120. The drive 170 is connected to rotate the longitudinal support 120 and the modules 200 about the longitudinal axis A to track the elevation of the sun during the course of the day. The drive 170 rotates the longitudinal support to track the sun from a starting point at a beginning of the day to an ending point at the end of the day. In the embodiment of FIG. 13, the drive 170 rotates the longitudinal support in a counterclockwise direction indicated by arrow X during the course of the day. Prior to the start of the next day, the drive rotates the longitudinal support 120 in the opposite direction indicated by arrow Y (i.e., clockwise direction as illustrated in FIG. 13). The rotation in the second direction Y prepares the array 100 for tracking the elevation of the sun during the following day. In one embodiment, the drive 170 takes only a short period of time (e.g., several minutes) to rotate the array in the second direction from the ending point to the starting point.

During an initial period of the day, the weight of the array 100 is such that the drive 170 applies a force to rotate the array 10G in the direction X. At some point during the day, the distribution of mass of the array 100 shifts and the weight tends to rotate or pull the array 100 in the direction X. This shifting that causes the array to tend to rotate forward is referred to as backlash. In one embodiment, once this occurs, the drive 170 applies a braking force to slow the rotation such that the array 100 continues to track the elevation of the sun during the remainder of the day. In one embodiment, this point starts immediately after the solar cell modules 200 reach a specific rotational position, such as but not limited to a top-dead-center rotational position relative to the longitudinal support 120. When this occurs, the weight of the array 100 causes a strain on the drive 170 as the drive 170 now acts against the pulling force of the array 100. This may negatively affect the positional accuracy of the array 100 causing the modules 200 to become out of alignment with the sun during the course of the day.

Figure 14A:
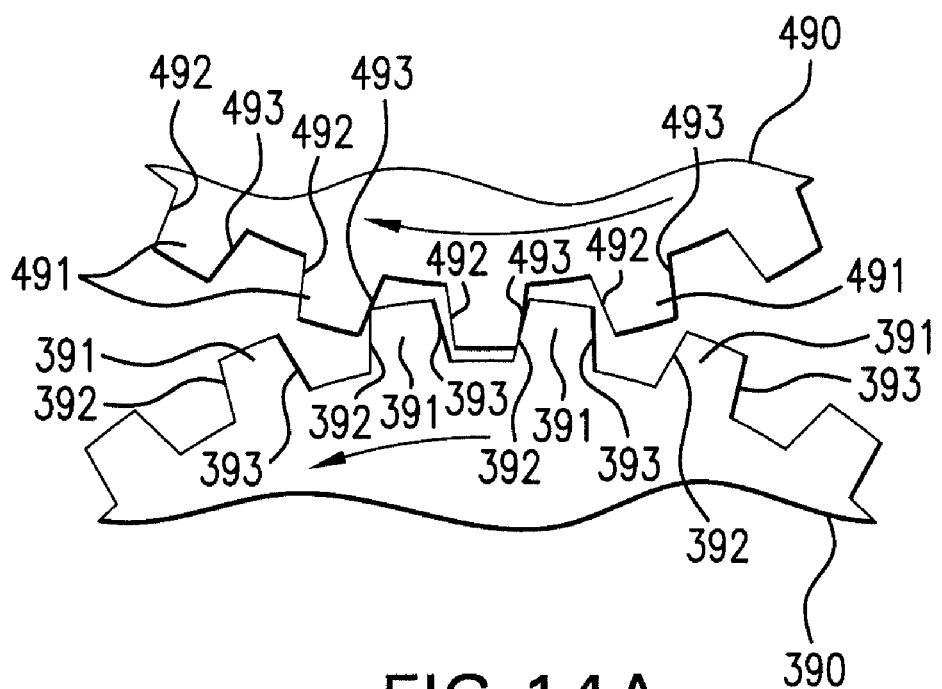
FIG. 14A is a schematic side view of gears of a drive train in a first orientation according to one embodiment.
Figure 14B:
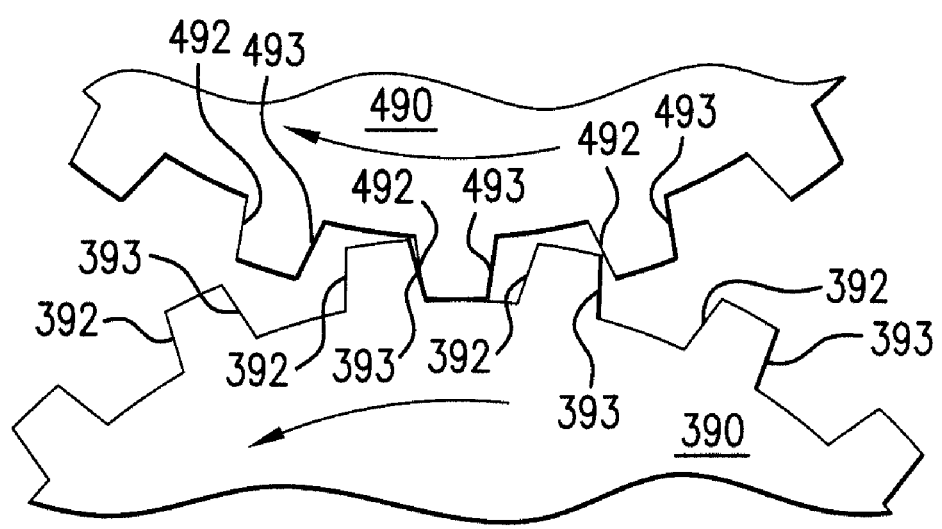
FIG. 14B is a schematic side view of gears of a drive train in a second orientation according to one embodiment.

Further, this backlash shift could cause gears in the drive 170 and/or the longitudinal support 120 to become disengaged. FIGS. 14A and 14B illustrate the orientations of the gears 390, 490. Gear 390 is operatively connected to the drive 170 and engages with gear 490 operatively connected to the longitudinal support 120. Gears 390, 490 may be the only two gears of a drive train that connects the drive 170 with the longitudinal support 120, or may be two of a more extensive drive train. Gear 390 includes a plurality of teeth 391 spaced around the perimeter each with a first edge 392 and a second edge 393. Likewise, gear 490 includes a plurality of teeth 491 each with first and second edge 492, 493. Gears 390, 490 may be substantially similar, or may include different sizes, number of teeth, and/or teeth spacing depending upon the context of use.

FIG. 14A illustrates the orientation when the drive 170 applies a force to rotate the longitudinal support 120. The first edges 392 of the teeth 391 of gear 390 contact against the second edges 493 of the teeth 419 of gear 490. This contact transfers the force of the drive 170 through the gears 390, 490 to rotate the longitudinal support 120.

In the event of a backlash shift as illustrated in FIG. 14B, the rotational speed of gear 490 is greater than the rotational speed of gear 390. This causes gear 490 to rotate ahead of gear 390 and there is no longer contact between edges 392 and 493. Gear 490 rotates ahead with the first edges 492 contacting against the second edges 393. In some instances, this contact causes the gear 490 to actually drive gear 390 until the array 100 settles to an equilibrium position. This causes the solar cell modules 200 to become misaligned with the sun. In one embodiment, the array 100 rotates forward an amount with the solar cell modules 200 being located vertically below the longitudinal support 120.

To prevent this from occurring, a balancing or dynamic anti-backlash mechanism 350 may be connected to the array 100. FIG. 13 schematically illustrates a mechanism 350 that applies a force to the array 100 to urge rotation in the second direction Y. The mechanism 350 provides for the drive 170 to drive the longitudinal support with the surfaces 392 on gear 390 remaining in contact with the surfaces 493 of gear 490.

FIG. 3 illustrates a dynamic anti-backlash mechanism 350 that includes a pulley 351, weight 352, and cable 353. The pulley 351 is connected to the longitudinal support 120. FIG. 3 illustrates the pulley 351 at the end of the longitudinal support 120, although other embodiments may position the pulley 351 at different locations along the length. The weight 352 is attached to the pulley 351 by the cable 353. The weight 352 hangs downward from the pulley 351 and may ride along guide rails (not illustrated). The cable 353 may include a variety of lengths and constructions, including rope, chain, and braided wire.

In use, the weight 352 may be spaced a distance from the longitudinal support 120 at the start of the day. As the day progresses, the drive 170 rotates the longitudinal support 120 in a first direction causing the cable 352 to wrap around the pulley 351 and move the weight upward towards the longitudinal support 120. The mechanism 350 applies a counterbalance force to the array 100 to counteract the backlash weighting that may occur at some point during the day. At the end of the day, the weight 352 is positioned in closer proximity to the longitudinal support 120. Prior to beginning tracking during the next day, the drive 170 rotates the longitudinal support in a second opposite direction. This causes the cable 353 to unwind from the pulley 351 and the weight 352 to move downward away from the longitudinal support 120. This force applied by the mechanism 350 to the array 100 assists the drive 170 in rotating the array 100 back to the starting position.

Figure 11:
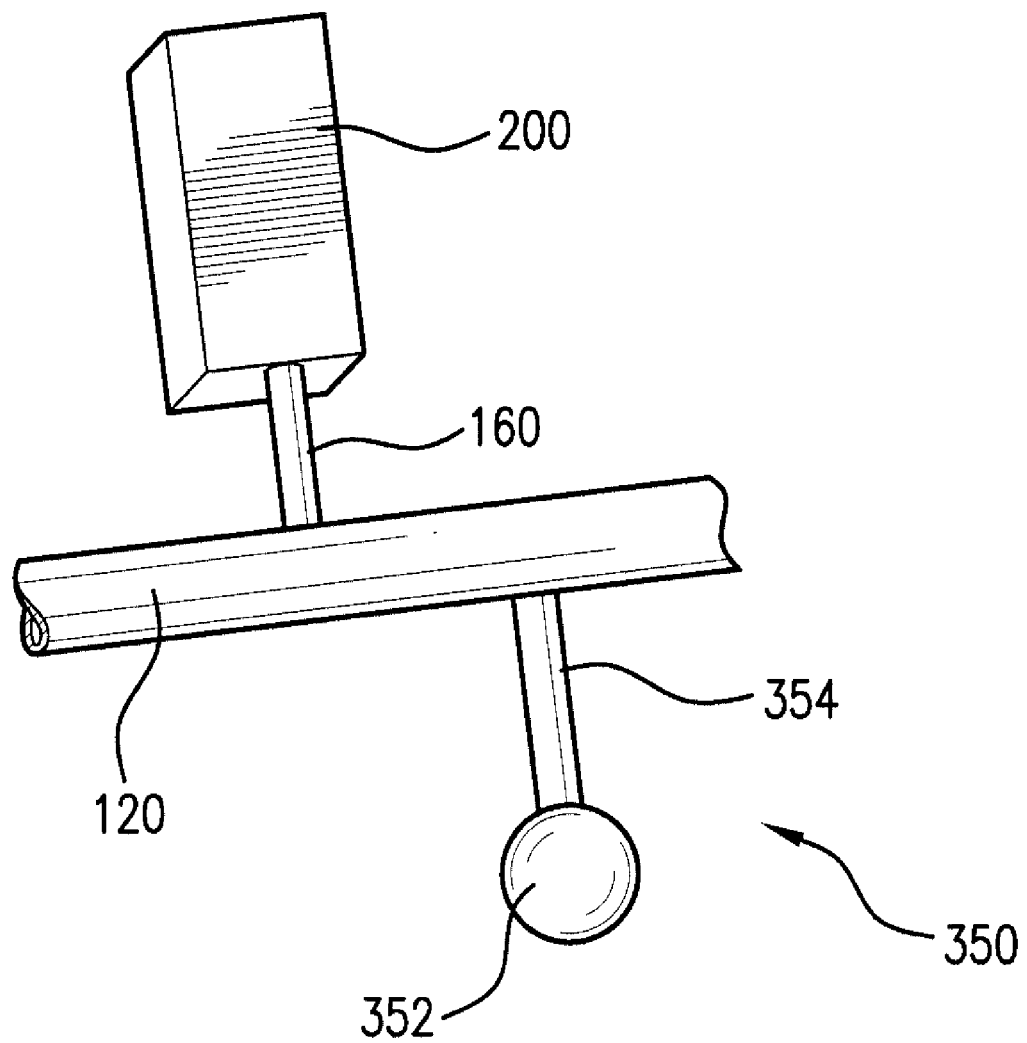
FIG. 11 is a schematic side view of an anti-backlash mechanism extending outward from a longitudinal support according to one embodiment.

FIG. 11 includes an anti-backlash mechanism 350 with the weight 352 positioned on a rigid support 354 that extends outward from the longitudinal support 120. The amount of the weight 352 and the length of the support 354 are configured to assist the drive 170 in rotation of the array 100.

The dynamic anti-backlash mechanisms 350 may be configured for the drive 170 to apply a constant torque to the longitudinal support 120 during rotation in the first direction. The drive 170 may further include a controller to apply a constant torque to the longitudinal support 120.

The dynamic anti-backlash mechanisms 350 may balance an unbalanced array 100. The uneven balancing may be caused by an uneven number of mounts 160 and solar cell modules 200 on one side of the longitudinal support 120. The amount of the weight 352 and length of the support 354 are determined to counterbalance the otherwise uneven weight distribution on the longitudinal support 120.

The balanced weighting of the array 100 eliminates or reduces weight loading and frictional loading issues with the drive 170. This reduces power requirements for the drive 170 and frictional wear on the drive train. The balanced weighting may also improve tracking of the array 100 due to reduced strain in the drive 170 and the drive train.

Figure 12:
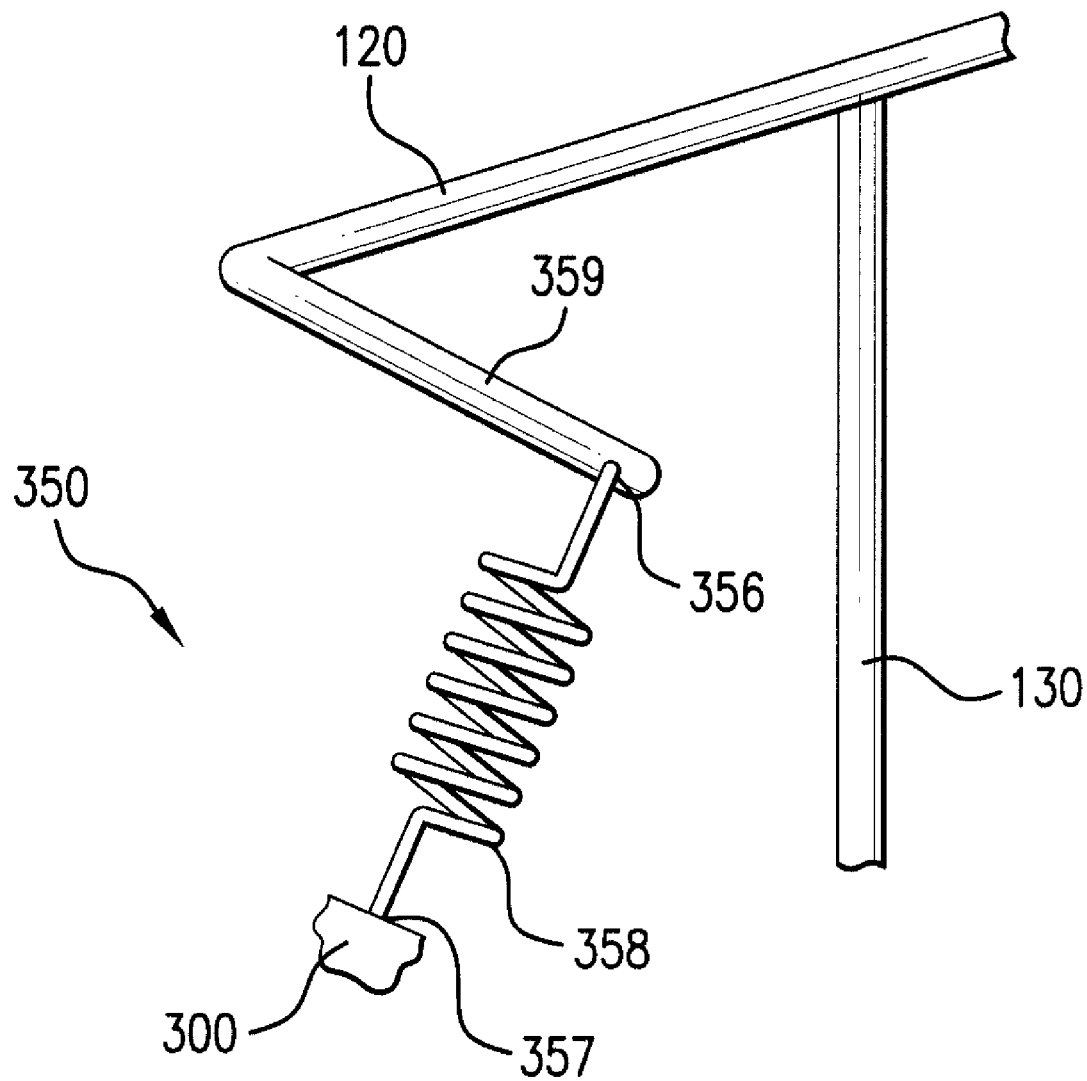
FIG. 12 is a partial schematic view of a biasing member operatively connected to the longitudinal support according to one embodiment.

The dynamic anti-backlash mechanism 350 may also include one or more tension members connected to the longitudinal support 120. FIG. 12 includes an embodiment with a tension member 358 operatively connected to the longitudinal support 120. The tension member 358 includes a first end 356 attached to the longitudinal support 120, and a second end 357 anchored at a point away from the longitudinal support such as on the surface 300, vertical support 130, or other. An extension arm 359 may extend outward from the longitudinal support 120 and provide an attachment point for the first end 356 away from the longitudinal support 120. In use, rotation of the longitudinal support 120 causes the tension member 358 to elongate and apply a return force. The tension member 358 may apply a greater force the farther the longitudinal member 120 rotates to offset the increasing weight offset caused by rotation of the array 100. The tension member 358 may further include a coil spring that extends around the longitudinal support. One of the first and second ends 356, 357 is attached to the longitudinal support 120. Rotation of the longitudinal support 120 causes the tension member 358 to again provide a return force.

In one specific embodiment, the dynamic anti-backlash mechanism 350 includes two tension springs each with a 160 lb maximum force that are anchored to one of the vertical supports 130. The longitudinal support 120 includes a sprocket that is connected to the springs with a chain. In one embodiment, the sprocket is a Martin 50A65 sprocket, and the chain includes three feet of #50 chain. During the course of the day, the dynamic anti-backlash mechanism 350 applies varying amounts of force as the array moves to track the sun. In the morning, the moment created by the array 100 acts counterclockwise and the dynamic anti-backlash mechanism 350 works as an anti-backlash device with the springs in a relaxed condition and contributing very little force. By noon, the array 100 is practically balanced and the springs produce about half of the force (about 80 lbs each in the embodiment of the 160 lb springs) creating a counterclockwise anti-backlash moment. Later in the afternoon, the moment created by the array 100 changes polarity and acts in the opposite direction with the springs producing near full force that is capable to overpower the force in the opposite direction and still act as an anti-backlash mechanism.

Figure 15:
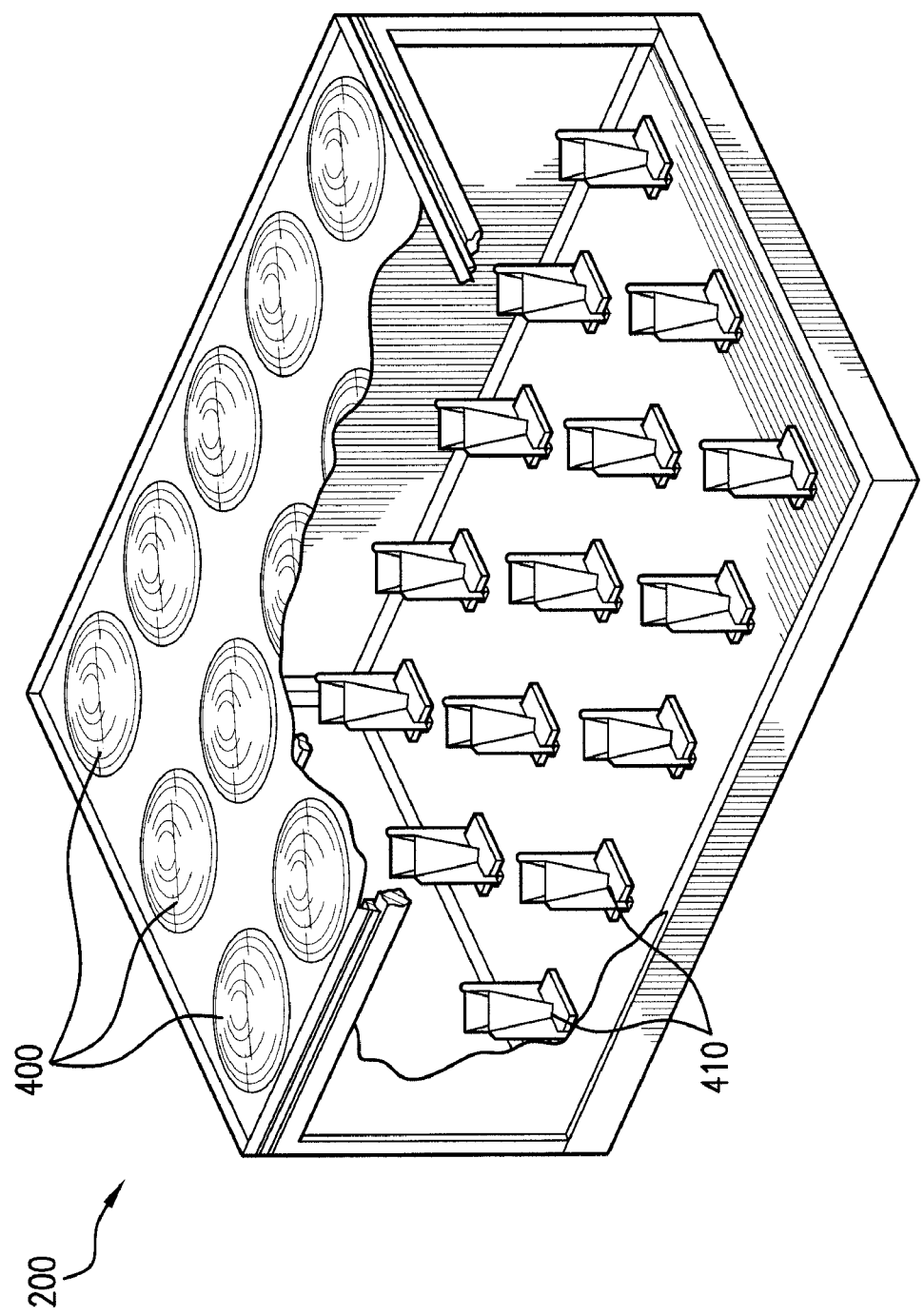
FIG. 15 is a perspective cut-away view of a solar cell array module according to one embodiment.

In one embodiment, the solar cell modules 200 are each about 43" by 67". FIG. 15 illustrates an embodiment of a solar cell module 200 with an aluminum frame and plastic or corrugated plastic sides that reduce the overall weight to about 70 pounds. In one embodiment, each solar cell module 200 includes a 3×5 array of lenses 400 that are positioned over corresponding receivers 410. The lenses may include various shapes and sizes with one specific embodiment including lenses that are about 13" square. Further, the focal length between the lenses 400 and the receivers 410 is about 20".

When mounted on the surface 300, the longitudinal support 120 may, be positioned in a north N-south S orientation as illustrated in FIG. 1. In one embodiment, the surface 300 is the surface of the Earth. The longitudinal support 120 includes a length to space a desired number of solar cell modules 200. Throughout the course of the day, the array 100 is adjusted to maintain the solar cell modules 200 facing towards the sun. The drive 170 may be periodically activated to provide a force to rotate the longitudinal support 120 and hence each of the mounts 160 and attached solar cell modules 200. The force applied by the drive 170 provides for each of the solar cells receivers 200 to be moved a same amount such that each solar cell array, module 200 is synchronized and move in unison. Rotation of the longitudinal support 120 may provide for the solar cell modules 200 to track the elevation of the sun during the course of the day.

In addition to the rotation of the longitudinal support 120, the one or more drives 180 move the linkages 140 to further maintain the solar cell modules 200 aligned with the sun. The drive(s) 180 are periodically activated to move the first linkage 140a and attached string of linkages 140. This movement causes the couplings 150 and attached mounts 160 and solar cell modules 200 to pivot about the various axes B. These axes B may, be orthogonal to the axis A. The string of linkages 140 provides for each of the solar cell modules 200 to again move in unison about their respective axis. B. The movement about the B axes may, allow the solar cell modules 200 to track the azimuthal position of the sun during the course of the day.

A controller 190 may control the movement of the terrestrial solar tracking array 100. The controller 190 may include a microcontroller with associated memory. In one embodiment, controller 190 includes a microprocessor, random access memory, read only memory, and in input/output interface. The controller 190 controls operation of the one or more drives 170 for rotating the longitudinal support 120 and the solar cell modules 200 about the first axis A. The controller 190 further controls the one or more drives 180 for driving the linkages 140 and rotating the solar cell modules about the second axes B. The controller 190 may include an internal timing mechanism such that the operation of the drives corresponds to the time of day for the solar cell modules 200 to track the azimuth and elevation of the sun.

The shadow cast by a given solar cell module 200 depends on its size and shape, and also on its location relative to the location of the sun in the sky. In the East-West direction, the sun location can vary by up to 150°. In this connection, it should be noted that it is generally accepted that, where the elevation of the sun is below 15° above the horizon, its rays are of insufficient strength to generate a useful amount of electricity. The latitude at which the solar cell array 100 is positioned is, therefore, of little influence.

In the North-South direction, the sun location varies by 46°, given that the earth's axis is tilted at an angle of 23° with respect to its orbit around the sun. In this connection, it will be appreciated that latitudes below 23° are subject to different conditions, and that latitudes above 45° are probably not relevant due to poor direct normal insolation (DNI) levels.

The solar cell array 100 is constructed in a manner to eliminate or minimize shadowing problems between solar cell modules 200. In one embodiment, the longitudinal support 120 and the individual sections 121 of the solar cell modules 200 are sized to space apart each module 200 such that it is fully illuminated for positions where the sun is 15° above the horizon, and that there is no shadowing of any given module 200 by any other module 200.

Figure 16:
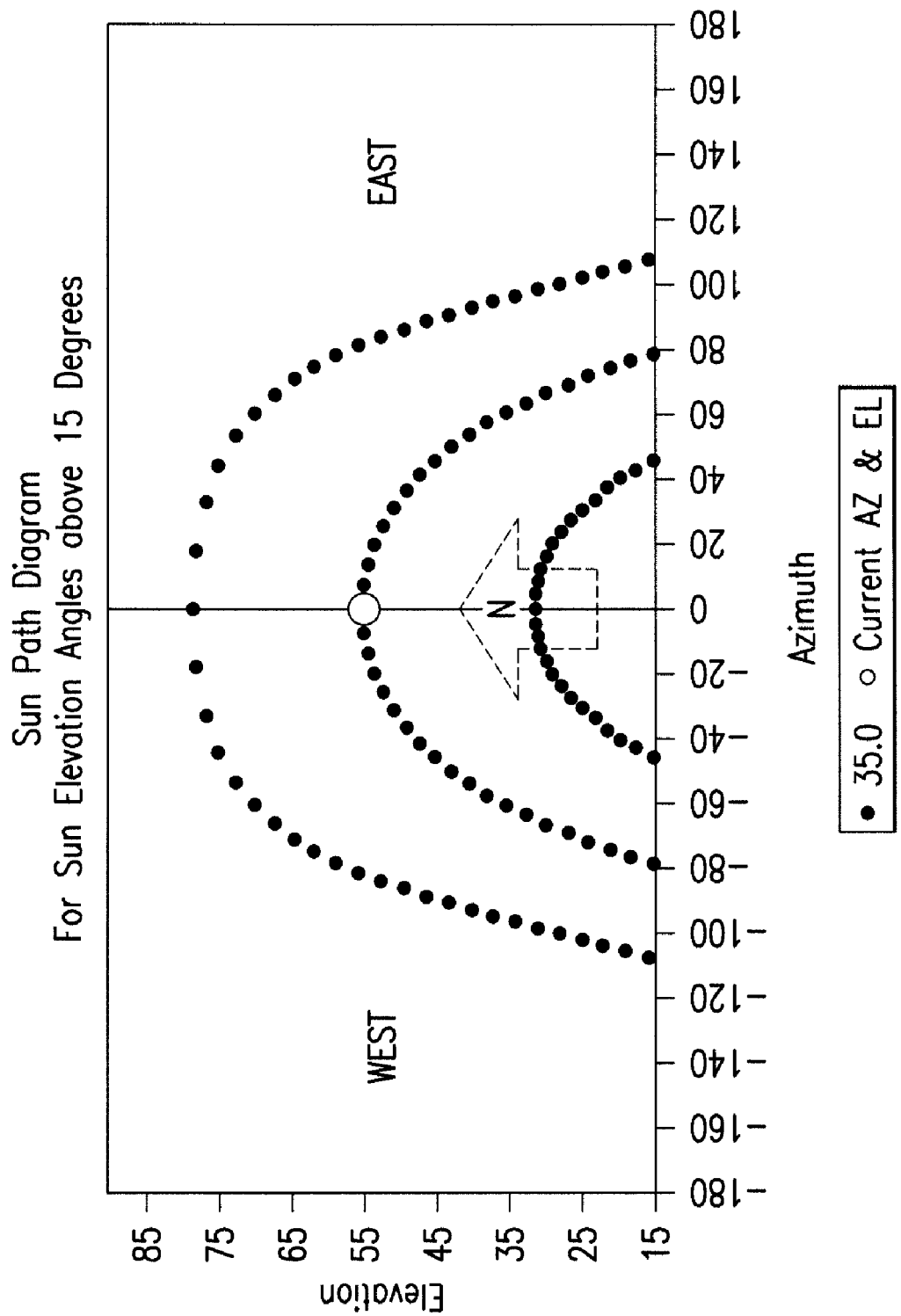
FIG. 16 is a graph illustrating the sun's path on the earth as a function of elevation and azimuth.

FIG. 16 is a sun path diagram showing the elevation of the sun for all angles above 15° at a latitude of 35° North. The graph shows the sun path for three times of the year, namely at the summer solstice (indicated by the highest dotted line), at the winter solstice (indicated by the lowest dotted line), and at the equinoxes (indicated by the middle dotted line). At all other dates, the sun path falls within the envelope defined by the highest and lowest dotted lines. Thus, at the winter solstice, the sun path goes from a negative azimuth angle of about 45° to a positive azimuth angle of about 45°, and from an elevation of 15° to about 27°, and then back to 15°. Similar ranges are apparent for a sun path at the summer solstice and at the equinoxes.

U.S. Pat. No. 7,381,886 assigned to Emcore Corporation discloses solar cell arrays and positioning relative to the sun path and is herein incorporated by reference in its entirety.

In one embodiment, the terrestrial solar tracking array 100 can be installed in a straight-forward manner. The various components are sized to fit within a standard vehicle and are light-weight to allow installation by a single person or limited number of persons. Further, the modular aspect of the array 100 facilitates modifications after the initial installation. Additional sections 121 and vertical supports 130 may be added to the frame 110 to accommodate a desired number of additional solar cell modules 200. Further, the size of the array 100 may be reduced after installation by removing one or more solar cell modules 200. One or more dynamic anti-backlash mechanisms 350 may be added to the array 100 as necessary. In one embodiment, additional mechanisms 350 are added when the size of the array 100 is increased to accommodate additional solar cell modules 200. Further, the weight 352 or number or sizes of the biasing mechanisms may be altered to provide the necessary balancing forces.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A terrestrial solar tracking photovoltaic array comprising:
   a longitudinal support constructed from a plurality of discrete sections placed in an end-to-end configuration;
   a drive operatively connected to the longitudinal support to rotate the longitudinal support about a first axis in first and second rotational directions;
   a plurality of mounts connected to the longitudinal support and spaced apart along a length of the longitudinal support;
   a plurality of solar cell array modules each being connected to different ones of the plurality of mounts, each of said solar cell modules comprising a rectangular case with a plurality of lenses positioned over corresponding receivers;
   a string of linkages spaced apart from the longitudinal support and connecting together each of the plurality of mounts, each of the linkages including a discrete length;
   the longitudinal support being rotatable about the first axis by the drive to simultaneously move each of the solar cell modules within a first plane to track the sun during the course of a day; and
   the string of linkages being movable axially along the longitudinal support to rotate each of the plurality of mounts and the connected solar cell modules within second planes that are each orthogonal to the first plane to track the sun during the course of the day.

2. The terrestrial solar tracking photovoltaic array of claim 1, further comprising a dynamic anti-backlash mechanism connected to the longitudinal support to assist the drive in rotating the longitudinal support.

3. The terrestrial solar tracking photovoltaic array of claim 2, further comprising a first gear operatively connected to the drive and a second gear operatively connected to the longitudinal support, the dynamic anti-backlash mechanism being configured to maintain first edges of gear teeth of the first gear in contact with second edges of the second gear during the tracking operation during the course of the day.

4. The terrestrial solar tracking photovoltaic array of claim 1, further comprising a dynamic anti-backlash mechanism connected to the longitudinal support to counteract a force acting on the longitudinal support caused by the distribution of mass of the plurality of solar cell modules after the longitudinal support is rotated by the drive beyond a rotational position.

5. The terrestrial solar tracking photovoltaic array of claim 4, wherein the dynamic anti-backlash mechanism is configured for the drive to apply a constant torque on the longitudinal support during movement in the first rotational direction between a first rotational position at a beginning of a day and a second rotational position at an end of a day.

6. The terrestrial solar tracking photovoltaic array of claim 4, wherein the dynamic anti-backlash mechanism comprises a pulley connected to the longitudinal support and a cable that extends from the pulley and connects to a weight.

7. The terrestrial solar tracking photovoltaic array of claim 4, wherein the dynamic anti-backlash mechanism maintains a constant potential energy level of the array.

8. The terrestrial solar tracking photovoltaic array of claim 1, wherein a center of gravity of the array is positioned along the longitudinal support.

9. The terrestrial solar tracking photovoltaic array of claim 1, further comprising a controller operatively connected to the drive and the string, of linkages to control rotation of the longitudinal support about the first axis and the axial movement of the string of linkages.

10. The terrestrial solar tracking photovoltaic array of claim 1, wherein the longitudinal support is a pipe with a diameter of about 4 inches.

11. The terrestrial solar tracking photovoltaic array of claim 1, wherein the plurality of solar cell array modules each include a rectangular shape with a width of about 43 inches and a length of about 67 inches.

12. A terrestrial solar tracking photovoltaic array comprising:
- a longitudinal support extending over the surface of the earth;
- a drive operatively connected to the longitudinal support to rotate the longitudinal support in a first direction during the course of a day, to track the sun about a first axis, and to rotate the longitudinal support in a second direction after an end of the day;
- a plurality of planar solar cell modules pivotably coupled to the longitudinal support and spaced along a length of the longitudinal support, said modules being aligned in pairs along the length of the longitudinal support with a first module of said pair extending outward from the longitudinal support in a first direction and a second module of said pair extending outward in an opposite second direction;
- a plurality of vertical supports that each include a first end configured to contact against a support surface and a second end operatively connected to the longitudinal support, each of said vertical supports being spaced away from each of said solar cell modules along the longitudinal support;
- said longitudinal support being journaled for rotation to allow said modules to simultaneously track the sun about the first axis during the course of a day;
- a balancing mechanism connected to the longitudinal support configured to apply a force to rotationally urge the longitudinal support in the second direction;
- said modules being pivotably coupled to allow each of said modules to simultaneously rotate along an axis substantially orthogonal to the longitudinal axis of said longitudinal support and track the sun about said axis substantially orthogonal to the longitudinal axis during the course of the day.

13. The terrestrial solar tracking photovoltaic array of claim 12, wherein the balancing mechanism is configured to apply a force to the longitudinal support to counteract a distribution of mass of the plurality of solar cell modules after the longitudinal support has been rotated in the first direction beyond a predetermined rotational position.

14. The terrestrial solar tracking photovoltaic array of claim 13, further comprising a first gear operatively connected to the drive and a second gear operatively connected to the longitudinal support, wherein the balancing mechanism maintains the first and second gears engaged together during rotation of the first gear in a first direction to track the sun about the first axis.

15. The terrestrial solar tracking photovoltaic array of claim 12, wherein the plurality of solar cell modules are positioned along the longitudinal support with a center of gravity being aligned with the longitudinal support.

16. The terrestrial solar tracking photovoltaic array of claim 12, wherein the balancing mechanism comprises a pulley centered along the longitudinal support, a weight, and a cable that extends between the weight and the pulley.

17. The terrestrial solar tracking photovoltaic array, of claim 12, wherein the balancing mechanism maintains a constant potential energy level of the array.

18. The terrestrial solar tracking photovoltaic array of claim 12, further comprising a second balancing mechanism positioned along the longitudinal support, the second balancing mechanism being spaced away from the balancing mechanism along a length of the longitudinal support.

19. The terrestrial solar tracking photovoltaic array of claim 12, wherein each solar cell module includes a rectangular case with a plurality of lenses positioned over corresponding receivers.

20. The terrestrial solar tracking photovoltaic array of claim 19, wherein the rectangular case includes a width of about 43 inches and a length of about 67 inches.

21. The terrestrial solar tracking photovoltaic array of claim 12, further comprising a string of linkages spaced apart from the longitudinal support and connecting together each of the solar cell modules, the string of linkages being axially movable along the longitudinal support to rotate the solar cell modules along the axis substantially, orthogonal to the longitudinal axis to track the sun during the course of the day.

22. The terrestrial solar tracking photovoltaic array of claim 12, wherein each of the plurality of vertical supports include a rectangular cross-sectional shape with a height and width each about 4 inches.

23. The terrestrial solar tracking photovoltaic array of claim 12, wherein the longitudinal support extends over the surface of the earth substantially in a north-south direction.

24. A terrestrial solar tracking photovoltaic array comprising:
- a longitudinal support;
- a plurality of mounts connected to the longitudinal support and spaced apart along a length of the longitudinal support;
- a plurality of solar cell modules connected to the plurality of mounts and each including a plurality of lenses that align with a corresponding receiver;
- a first drive configured to rotate said longitudinal support in a first direction about a first axis to simultaneously move each of the solar cell modules within a first plane to track the sun during the course of a day, the first drive further configured to rotate said longitudinal support in a second direction to a starting point at end of the day;
- a balancing mechanism connected to said longitudinal support to urge rotation of said longitudinal support in the second direction towards the starting point;
- a string of linkages movable axially along the longitudinal support to rotate each of the plurality of mounts and the connected solar cell modules within second planes that are each orthogonal to the first plane to track the sun during the course of the day; and a second drive configured to axially move the string of linkages along the longitudinal support.

25. The terrestrial solar tracking photovoltaic array of claim 24, wherein the balancing mechanism maintains a constant potential energy level of the array.

26. The terrestrial solar tracking photovoltaic array of claim 24, wherein the longitudinal support comprises a plurality of discrete sections that are attached together in an end-to-end arrangement.

27. The terrestrial solar tracking photovoltaic array of claim 26, wherein each of said discrete sections includes one of said plurality of mounts.

28. The terrestrial solar tracking photovoltaic array of claim 24, wherein the balancing mechanism applies a force to the longitudinal support such that the first drive applies a constant force to the longitudinal support during rotation in the first direction during the course of the day.

* * * * *